US007459372B2

(12) United States Patent  
Park et al.

(10) Patent No.: US 7,459,372 B2  
(45) Date of Patent: Dec. 2, 2008

(54) METHODS OF MANUFACTURING A THIN FILM INCLUDING HAFNIUM TITANIUM OXIDE AND METHODS OF MANUFACTURING A SEMICONDUCTOR DEVICE INCLUDING THE SAME

(75) Inventors: Hong-Bae Park, Seoul (KR); Yu-Gyun Shin, Gyeonggi-do (KR); Sang-Bom Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 550 days.

(21) Appl. No.: 11/191,423

(22) Filed: Jul. 28, 2005

(65) Prior Publication Data

US 2006/0035405 A1     Feb. 16, 2006

(30) Foreign Application Priority Data

Aug. 11, 2004 (KR) .................. 10-2004-0063073

(51) Int. Cl.
*H01L 21/471* (2006.01)
*H01L 21/20* (2006.01)

(52) U.S. Cl. .................. 438/396; 438/591; 438/763; 438/785

(58) Field of Classification Search .................. 438/396, 438/591, 763, 785
See application file for complete search history.

(56) References Cited

U.S. PATENT DOCUMENTS

| 5,416,356 | A  | 5/1995 | Staudinger et al. |
| 5,747,373 | A  | 5/1998 | Yu |
| 6,348,386 | B1 | 2/2002 | Gilmer |
| 6,607,973 | B1 | 8/2003 | Jeon |
| 6,828,218 | B2 | 12/2004 | Kim et al. |

(Continued)

FOREIGN PATENT DOCUMENTS

JP     2002-319583 A     10/2002

(Continued)

OTHER PUBLICATIONS

Notice to Submit Response, KR 10-2004-0056865, Dec. 16, 2005.

(Continued)

*Primary Examiner*—Evan Pert
(74) *Attorney, Agent, or Firm*—Myers Bigel Sibley & Sajovec, PA

(57) ABSTRACT

The present invention can provide methods of manufacturing a thin film including hafnium titanium oxide. The methods can include introducing a first reactant including a hafnium precursor onto a substrate; chemisorbing a first portion of the first reactant to the substrate, and physisorbing a second portion of the first reactant to the substrate and the chemisorbed first portion of the first reactant; providing a first oxidant onto the substrate; forming a first thin film including hafnium oxide on the substrate; introducing a second reactant including a titanium precursor onto the first thin film; chemisorbing a first portion of the second reactant to the first thin film, and physisorbing a second portion of the second reactant to the first thin film and the chemisorbed first portion of the second reactant; providing a second oxidant onto the first thin film; and forming a second thin film including titanium oxide on the first thin film. The present invention can further provide methods of manufacturing a gate structure and a capacitor.

27 Claims, 9 Drawing Sheets

U.S. PATENT DOCUMENTS

| | | |
|---|---|---|
| 2003/0013320 A1 | 1/2003 | Kim et al. |
| 2003/0040196 A1 | 2/2003 | Lim et al. |
| 2003/0232506 A1 | 12/2003 | Metzner et al. |
| 2005/0151184 A1 | 7/2005 | Lee et al. |
| 2006/0013946 A1 | 1/2006 | Park et al. |

FOREIGN PATENT DOCUMENTS

| | | |
|---|---|---|
| JP | 2002-367992 A | 12/2002 |
| KR | 2002-0032054 A | 5/2002 |
| KR | 2002-0091743 A | 12/2002 |
| KR | 2003-0018134 A | 3/2003 |
| KR | 2003-347297 A | 12/2003 |
| KR | 10-2004-0041944 A | 5/2004 |
| WO | WO 2004/017378 A2 | 2/2004 |

OTHER PUBLICATIONS

Beom-Jun Jin et al., "Methods of Forming a Thin Layer Including Hafnium Silicon Oxide Using Atomic Layer Deposition and Methods of Forming a Gate Structure and a Capacitor Including the Same", U.S. Appl. No. 11/180,121, filed Jul. 13, 2005.

METHODS OF MANUFACTURING A THIN FILM INCLUDING HAFNIUM TITANIUM OXIDE AND METHODS OF MANUFACTURING A SEMICONDUCTOR DEVICE INCLUDING THE SAME

CROSS-REFERENCE TO RELATED APPLICATION

This application claims priority to Korean Patent Application No. 2004-63073, filed Aug. 11, 2004, the disclosure of which is incorporated herein by reference in its entirety as if set forth fully herein.

FIELD OF THE INVENTION

The present invention relates to methods of manufacturing a thin film structure and methods of manufacturing a semiconductor device including the same. More particularly, the present invention relates to methods of manufacturing a thin film including hafnium titanium oxide by employing an atomic layer deposition process, and methods of manufacturing a semiconductor device including the same.

BACKGROUND OF THE INVENTION

A high-k dielectric layer has been employed to form a gate insulation layer of a metal oxide semiconductor (MOS) transistor or a dielectric layer of a capacitor where the high-k dielectric layer may have a thin equivalent oxide thickness (EOT) and may reduce leakage current flowing from a gate electrode of the MOS transistor toward a channel region of the MOS transistor, or flowing from an upper electrode of the capacitor toward a lower electrode of the capacitor.

A hafnium oxide layer has been utilized as the gate insulation layer of a MOS transistor or as the dielectric layer of a capacitor. A method of forming a hafnium oxide layer is described, for example, in U.S. Pat. No. 6,348,386 issued to Glimer. However, components included in the hafnium oxide layer may be crystallized at a relatively low temperature of above about 300° C. so that the leakage current may be augmented in the MOS transistor or the capacitor. More specifically, when the hafnium oxide layer is utilized as the gate insulation layer and a gate electrode of doped polysilicon is formed on the hafnium oxide layer, electron mobility in the channel region of the MOS transistor may be decreased due, in part, to the penetration of impurities such as boron (B).

In an attempt to address the above-mentioned phenomenon, a hafnium silicon oxide layer formed by an atomic layer deposition (ALD) process has been developed. The hafnium silicon oxide layer may possess a desirable equivalent oxide thickness as well as desirable insulation properties. A method of forming a hafnium silicon oxide layer using an atomic layer deposition process is described, for example, in U.S. Patent Application Publication No. 2003/232506, Japanese Patent Laid-Open Publication No. 2003-347297, Korean Patent Laid-Open Publication No. 2002-32054 and Korean Patent Laid-Open Publication No. 2001-35736. However, since the hafnium silicon oxide layer may have a low dielectric constant of about 10 to about 15, the hafnium silicon oxide layer may not be suitable for a semiconductor device having a design rule of below about 50 nm.

SUMMARY OF THE INVENTION

Embodiments of the present invention provide methods of manufacturing a thin film including hafnium titanium oxide that may possess a high dielectric constant.

In particular, embodiments of the present invention provide methods of manufacturing a thin film including introducing a first reactant including a hafnium precursor onto a substrate; chemisorbing a first portion of the first reactant to the substrate, and physisorbing a second portion of the first reactant to the substrate and the chemisorbed first portion of the first reactant; providing a first oxidant onto the substrate; forming a first thin film including hafnium oxide on the substrate by chemically reacting the first oxidant with the chemisorbed first portion of the first reactant; introducing a second reactant including a titanium precursor onto the first thin film; chemisorbing a first portion of the second reactant to the first thin film, and physisorbing a second portion of the second reactant to the first thin film and the chemisorbed first portion of the second reactant; providing a second oxidant onto the first thin film; and forming a second thin film including titanium oxide on the first thin film, by chemically reacting the second oxidant with the chemisorbed first portion of the second reactant. According to some embodiments, the methods are carried out using an atomic layer deposition (ALD) process. In some embodiments, the methods further include removing the physisorbed second portion of the first reactant; removing an unreacted first oxidant; removing the physisorbed second portion of the second reactant; and removing an unreacted second oxidant.

Further embodiments of the present invention provide methods of manufacturing a gate structure including forming a gate insulation layer on a substrate by atomic layer deposition using a hafnium precursor, a titanium precursor and an oxidant, wherein the gate insulation layer includes hafnium titanium oxide; forming a gate conductive layer on the gate insulation layer; and forming a gate insulation pattern and a gate conductive pattern on the substrate by etching the gate conductive layer and the gate insulation layer.

Embodiments of the present invention provide methods of manufacturing a capacitor including forming a lower electrode on a substrate; forming a dielectric layer on the lower electrode by atomic layer deposition using a hafnium precursor, a titanium precursor and an oxidant, wherein the dielectric layer includes hafnium titanium oxide; and forming an upper electrode on the dielectric layer.

According to some embodiments of the present invention, a thin film including hafnium titanium oxide that may possess a high dielectric constant may be more readily formed so that a semiconductor device including a gate structure or a capacitor may have desirable electrical characteristics when the thin film including hafnium titanium oxide is employed as a dielectric layer of the capacitor or as a gate insulation layer of the gate structure.

DETAILED DESCRIPTION OF EMBODIMENTS OF THE INVENTION

Figure 1:
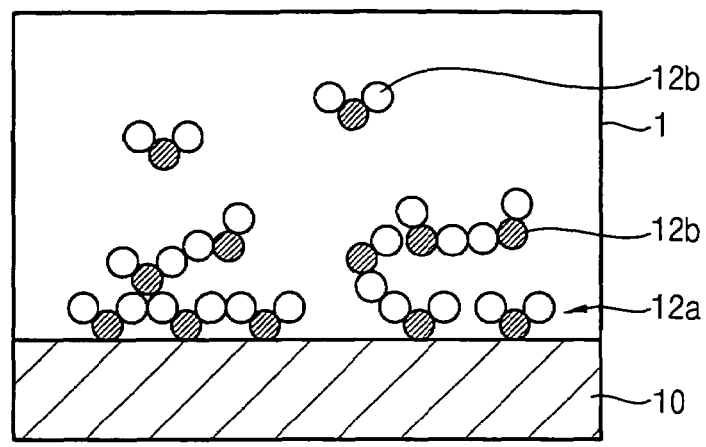
FIGS. 1 through 8 present cross-sectional views illustrating methods of manufacturing a thin film in accordance with some embodiments of the present invention.

The present invention will now be described more fully herein with reference to the accompanying drawings, in which embodiments of the invention are shown. This invention, however, may be embodied in many different forms and should not be construed as being limited to the embodiments set forth herein. Rather, these embodiments are provided so that this disclosure will be thorough and complete and will fully convey the concept of the invention to those skilled in the art.

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. Also, as used herein, "and/or" refers to and encompasses any and all possible combinations of one or more of the associated listed items. Unless otherwise defined, all terms, including technical and scientific terms used in the description of the invention, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it can be directly on the other layer or substrate, or intervening layers can also be present. However, when a layer, region or reactant is described as being "directly on" or introduced, exposed or feed "directly onto" another layer or region, no intervening layers or regions are present. Additionally, like numbers refer to like compositions or elements throughout.

Embodiments of the present invention are further described herein with reference to cross-section illustrations that are schematic illustrations of idealized embodiments of the present invention. As such, variations from the shapes of the illustrations as a result, for example, of manufacturing techniques and/or tolerances, are to be expected. In particular, the regions illustrated in the figures are schematic in nature and their shapes are not intended to illustrate the precise shape of a region of a device and are not intended to limit the scope of the present invention.

As will be appreciated by one of skill in the art, the present invention may be embodied as compositions and devices including the compositions as well as methods of making and using such compositions and devices.

Embodiments of the present invention provide methods of manufacturing a thin film. Referring to FIG. 1, a substrate 10 is loaded into a chamber 1. When the chamber 1 has a temperature of below about 150° C., a first reactant and a second reactant may exhibit diminished reactivity. When the chamber 1 has a temperature of above about 400° C., components included in a first thin film 14 and a second thin film 18 (see FIG. 8) may be crystallized at a faster rate, and the thin film 19 (see FIG. 8) may have undesirable characteristics when subjected to a chemical vapor deposition (CVD) process rather than exhibiting more desirable characteristics that may result as a consequence of employing an atomic layer deposition (ALD) process. Thus, in some embodiments, the chamber 1 has a temperature in a range of about 150° C. to about 400° C. In some embodiments, the chamber 1 may have a temperature in a range of about 250° C. to about 350° C. In some embodiments, the chamber 1 may have a temperature of about 300° C. At such temperatures, the thin film 19 may possess desirable characteristics when subjected to the atomic layer deposition (ALD) process.

After the first reactant is introduced into the chamber 1, the first reactant is provided onto the substrate 10. The first reactant includes a hafnium (Hf) precursor. In some embodiments, the hafnium precursor may include any suitable material that includes hafnium. In some embodiments, the material including hafnium includes tetrakis dimethyl amino hafnium (Hf[N(CH$_3$)$_2$]$_4$; TDMAH), tetrakis ethyl methyl amino hafnium (Hf[N(C$_2$H$_5$)CH$_3$]$_4$; TEMAH), tetrakis diethyl methyl amino hafnium (Hf[N(C$_2$H$_5$)$_2$]$_4$; TDEAH), HF[OC(CH$_3$)$_2$CH$_2$OCH$_3$]$_4$ and HF[OC(CH$_3$)$_3$]$_4$. These materials can be used alone or in a mixture thereof. In some embodiments of the present invention, the hafnium precursor includes TDMAH. In some embodiments, the hafnium precursor may include nitrogen.

The first reactant including the hafnium precursor is introduced onto the substrate 10 for a time period in a range from about 0.5 seconds to about 3 seconds. In some embodiments, the first reactant including the hafnium precursor is provided onto the substrate 10 for about one second. When the first reactant including the hafnium precursor is provided onto the substrate 10, a first portion of the first reactant 12a may be chemically adsorbed (i.e., chemisorbed) to the substrate 10 whereas a second portion of the first reactant 12b is physically adsorbed (i.e., physisorbed) to the substrate 10 and the first portion 12a, or alternatively, drifted in the chamber 1.

Figure 2:
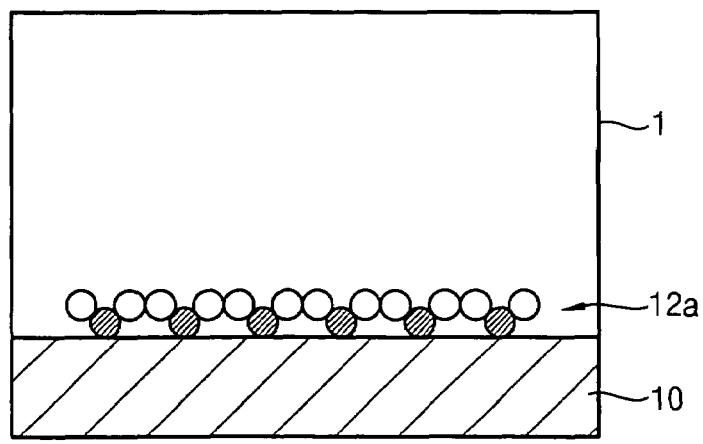

Referring to FIG. 2, a first purge gas is provided onto the substrate 10. The first purge gas may include an inactive gas such as nitrogen (N$_2$), helium (He), neon (Ne), argon (Ar) and the like. In some embodiments, the inactive gas is argon. The first purge gas may be introduced into the chamber 1 for a period of time in a range of about 0.5 seconds to about 3 seconds. In some embodiments, the first purge gas may be provided onto the substrate 10 for about one second. When the first purge gas is introduced into the chamber 1, the second portion of the first reactant 12b is removed from the chamber 1. More specifically, the physisorbed portion of the first reactant and the drifting portion of the first reactant are removed from the chamber 1 by providing the first purge gas into the chamber 1. In particular, radicals of CH included in the hafnium precursor may be removed from the substrate 10 and the chemisorbed first portion of the first reactant 12a. When the first purge gas is provided on the substrate 10, however, hafnium and nitrogen, when present, included in the hafnium precursor may not be removed from the substrate 10 by the first purge gas where hafnium and nitrogen may be chemisorbed to the substrate 10.

In some embodiments of the present invention, the radicals of CH may be removed from the substrate 10 and the chamber 1 by vacuuming the chamber 1 for a period of time in a range of about two seconds to about three seconds.

Figure 3:
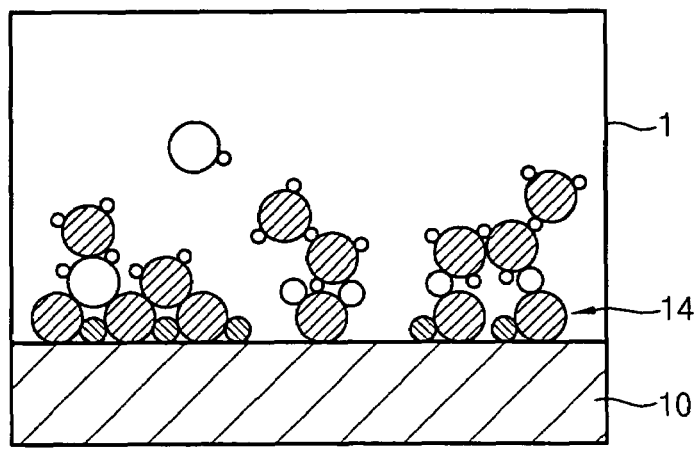

Referring to FIG. 3, after a first oxidant is introduced into the chamber 1, the first oxidant is provided on the chemisorbed first portion of the first reactant 12a. The first oxidant may include ozone ($O_3$), water ($H_2O$) vapor, hydrogen peroxide ($H_2O_2$), methanol ($CH_3OH$), ethanol ($C_2H_5OH$) and the like. These oxidants can be used alone, i.e., individually, or in combination with other suitable oxidants. The first oxidant may be introduced onto the substrate 10 for a period of time in a range from about one second to about five seconds. In some embodiments, the first oxidant may be provided onto the chemisorbed first portion of the first reactant 12a for about two seconds. When the first oxidant is introduced onto the chemisorbed first portion of the first reactant 12a, hafnium, and nitrogen when present, in the chemisorbed first portion of the first reactant 12a may be oxidized. Since TDMAH included in the first reactant may exhibit hydrophilic properties, the chemisorbed first portion of the first reactant 12a may be more readily oxidized. Consequently, a first thin film 14 including hafnium oxide may be formed on the substrate 10. When nitrogen is chemisorbed to the substrate 10, the first thin film 14 further includes nitrogen.

Figure 4:
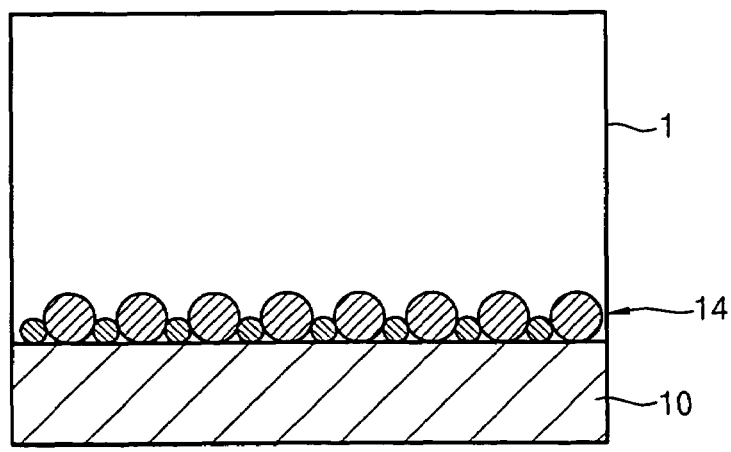

Referring to FIG. 4, a second purge gas is introduced into the chamber 1 to remove a remaining first oxidant from the first thin film 14. The second purge gas may include an inactive gas such as nitrogen, helium, neon, argon and the like. In some embodiments, the inactive gas is argon. The second purge gas may be introduced into the chamber 1 for a period of time in a range from about 0.5 seconds to about 3 seconds. In some embodiments, the second purge gas may be provided onto the first thin film 14 for about one second. After the second purge gas is introduced into the chamber 1, the remaining first oxidant may be removed from the chamber 1.

In some embodiments of the present invention, a desired thickness of the first thin film 14 including hafnium oxide may be achieved by repeatedly performing steps including providing the first reactant, introducing the first purge gas, providing the first oxidant and introducing the second purge gas.

Figure 5:
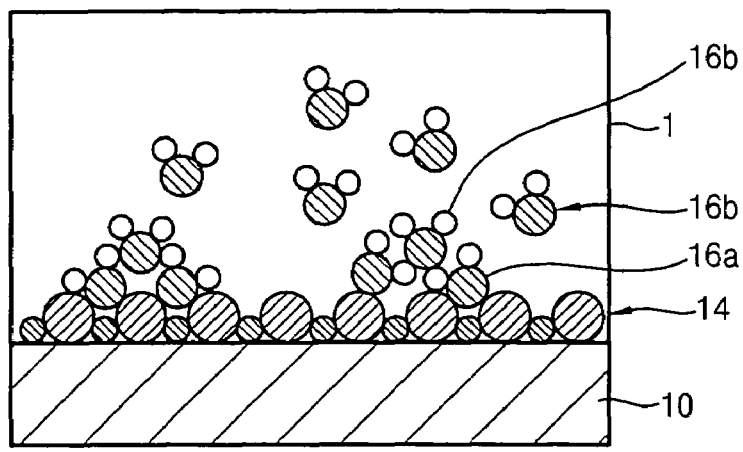

Referring to FIG. 5, a second reactant is provided onto the first thin film 14. The second reactant includes a titanium (Ti) precursor. The titanium precursor may include any suitable material that includes titanium. In some embodiments, the suitable material including titanium includes $TiCl_4$, $Ti(OC_2H_5)_4$, $Ti(OC_3H_7)_4$, $Ti(OC_4H_9)_4$, $Ti(O\text{-}i\text{-}Pr)_2(thd)_2$, $Ti(tmhd)_2(O\text{-}i\text{-}Pr)_2$, $TiO(DPM)_2$-[titanyl bis(dipivaloyl-methanato)], $Ti(MMP)_4$-[$Ti(OC_4H_8OCH_3)$] and the like. These materials can be used alone or in combination. In some embodiments of the present invention, the titanium precursor includes $TiCl_4$.

The second reactant including the titanium precursor is provided onto the first thin film 14 for a period of time in a range from about 0.5 seconds to about 3 seconds. In some embodiments, the second reactant including the titanium precursor is introduced onto the first thin film 14 for about 1 second. When the second reactant including the titanium precursor is provided onto the first thin film 14, a first portion of the second reactant 16a is chemisorbed onto the first thin film 14 whereas a second portion of the second reactant 16b is physisorbed to the first thin film 14 and the chemisorbed first portion of the second reactant 16a or is drifted in the chamber 1.

Figure 6:
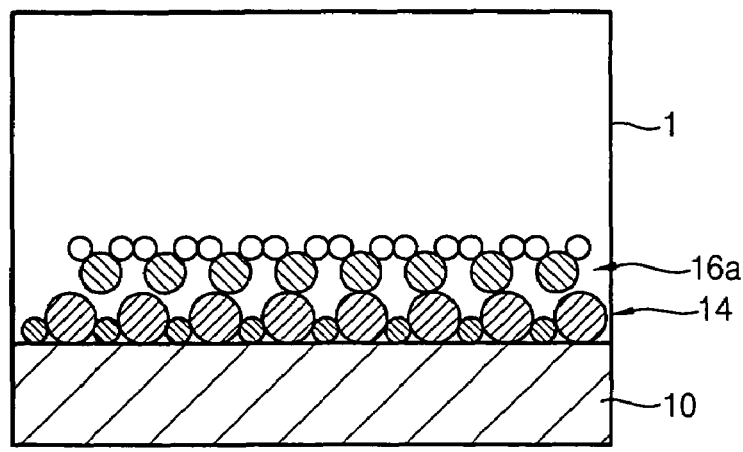

Referring to FIG. 6, after a third purge gas is introduced into the chamber 1, the third purge gas is provided onto the first thin film 14 and the chemisorbed first portion of the second reactant 16a. The third purge gas may include an inactive gas such as nitrogen, helium, neon, argon and the like. In some embodiments, the inactive gas is argon. The third purge gas may be provided onto the first thin film 14 and the chemisorbed first portion of the second reactant 16a for a period of time in a range from about 0.5 seconds to about 3 seconds. In some embodiments, the third purge gas may be provided for about one second. When the third purge gas is introduced onto the first thin film 14 and the chemisorbed first portion of the second reactant 16a, the physisorbed second portion of the second reactant 16b and the drifted second portion of the second reactant 16b are removed from the chemisorbed first portion of the second reactant 16a and the first thin film 14. In particular, radicals of Cl included in the titanium precursor are removed from the first thin film 14 and the chemisorbed first portion of the second reactant 16a by providing the third purge gas into the chamber 1. When the third purge gas is introduced onto the first thin film 14, however, titanium included in the titanium precursor may not be removed because titanium may be chemically adsorbed to the first thin film 14.

In some embodiments of the present invention, the radicals of Cl may be removed from the first thin film 14 and the chemisorbed first portion of the second reactant 16a by vacuuming the chamber 1 for a period of time in a range from about two seconds to about three seconds.

Figure 7:
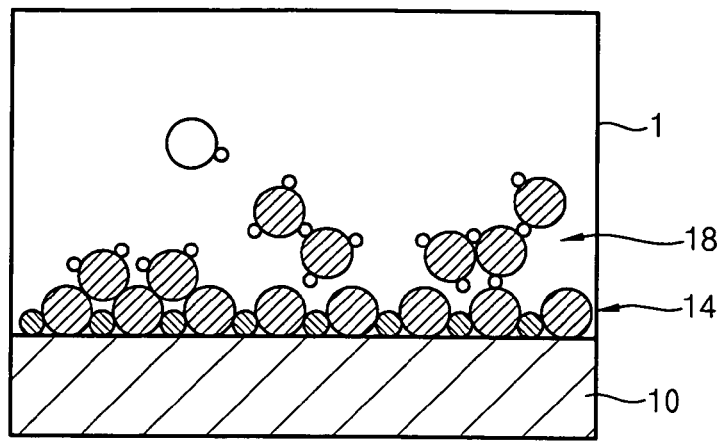

Referring to FIG. 7, a second oxidant is provided onto the first thin film 14 and the chemisorbed first portion of the second reactant 16a. The second oxidant may include $O_3$, $H_2O$ vapor, $H_2O_2$, $CH_3OH$, $C_2H_5OH$ and the like. These oxidants can be used alone or in combination. The second oxidant may be introduced onto the first thin film 14 for a period of time in a range from about one second to about five seconds. In some embodiments, the second oxidant may be provided onto the chemisorbed first portion of the second reactant 16a and the first thin film 14 for about two seconds. When the second oxidant is introduced onto the chemisorbed first portion of the second reactant 16a, titanium contained in the chemisorbed first portion of the second reactant 16a is oxidized. Since $TiCl_4$ included in the second reactant may have hydrophilic properties, the chemisorbed first portion of the second reactant 16a may be more readily oxidized. As a result, a second thin film 18 including titanium oxide may be formed on the first thin film 14. When nitrogen is chemisorbed to the first thin film 14, the second thin film 18 may further include nitrogen.

Figure 8:
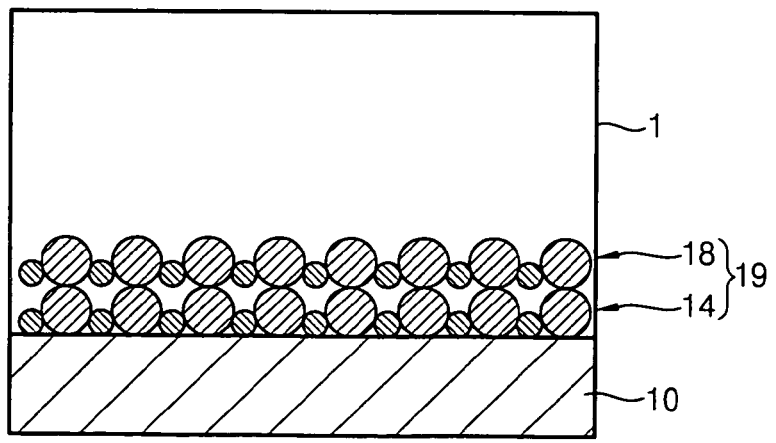

Referring to FIG. 8, a fourth purge gas is introduced into the chamber 1 and may remove a remaining second oxidant from the second thin film 18. The fourth purge gas may include an inactive gas such as nitrogen, helium, neon, argon and the like. In some embodiments, the inactive gas is argon. The fourth purge gas may be introduced into the chamber 1 for about 0.5 seconds to about three seconds. In some embodiments, the fourth purge gas may be provided onto the second thin film 18 for about one second. After the fourth purge gas is introduced into the chamber 1, the remaining second oxidant may be removed from the chamber 1. Consequently, the thin film structure 19 including the first and the second thin films 14 and 18 may be formed on the substrate 10.

In some embodiments of the present invention, the second thin film 18 including titanium oxide may have a desired thickness by repeatedly performing the steps of providing the second reactant, introducing the third purge gas, providing the second oxidant and introducing the fourth purge gas.

In some embodiments of the present invention, a thin film structure including hafnium titanium oxide having a desired thickness may be formed on a substrate by repeatedly executing the steps of providing the first reactant, introducing the first purge gas, providing the first oxidant, introducing the second purge gas, providing the second reactant, introducing the third purge gas, providing the second oxidant and introducing the fourth purge gas.

In some embodiments of the present invention, a ratio between hafnium and titanium included in a thin film structure may be controlled by adjusting the number of iterations of performing steps that include providing the first reactant, introducing the first purge gas, providing the first oxidant, introducing the second purge gas, providing the second reactant, introducing the third purge gas, providing the second oxidant and introducing the fourth purge gas.

As described above, a thin film structure including hafnium titanium oxide may be formed using a first reactant including a hafnium precursor and a second reactant including a titanium oxide. Thus, the thin film structure including hafnium titanium oxide may be formed on a substrate utilizing a less complex process as compared to more conventional methods. Additionally, the iterations of performing the processes for forming a first thin film including hafnium oxide and a second thin film including titanium oxide may be controlled so that the thin film may have a desired thickness and/or a desired ratio between hafnium and titanium.

Figure 9:
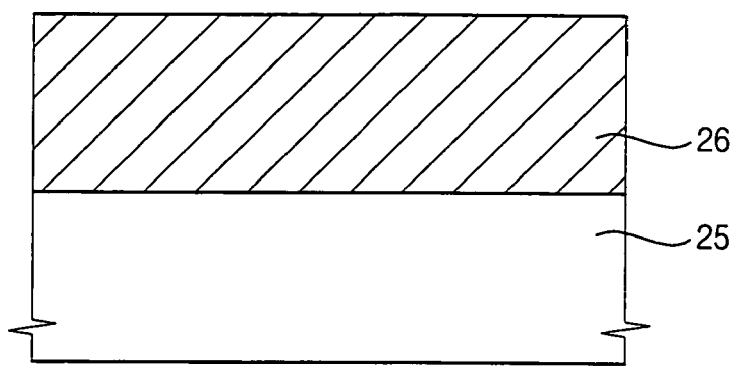
FIGS. 9 through 11 present a cross-sectional view illustrating a thin film in accordance with some embodiments of the present invention.

Referring to FIG. 9, a thin film structure 26 is formed by repeatedly performing steps associated with forming a first thin film of hafnium oxide and a second thin film of titanium oxide as described above. Thus, the thin film 26 including hafnium titanium oxide may be formed on a substrate 25.

Figure 10:
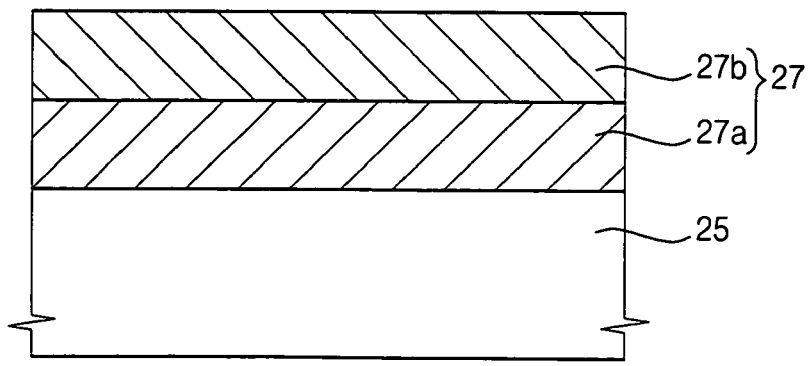

Referring to FIG. 10, a thin film structure 27 is formed on a substrate 25 by performing steps associated with forming a first thin film 27a of hafnium oxide and steps associated with forming a second thin film 27b of titanium oxide as described above. Therefore, the thin film 27 may have a multi-layer structure that includes the first thin film 27a and the second thin film 27b.

Figure 11:
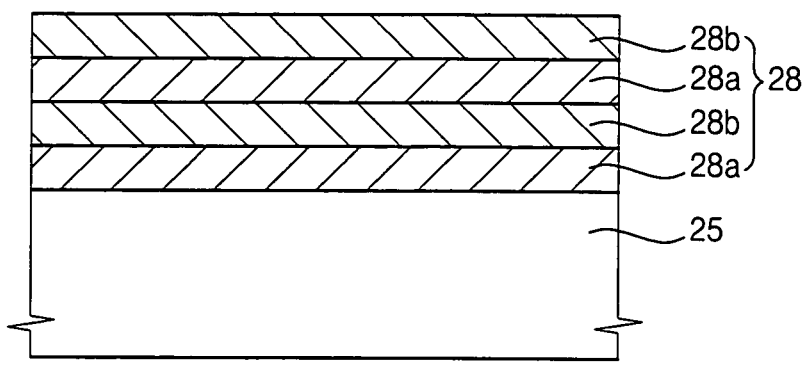

Referring to FIG. 11, a thin film structure 28 is formed on a substrate 25 by repeatedly performing steps associated with forming first thin films 28a of hafnium oxide and steps associated with forming second thin films 28b of titanium oxide as described above. Accordingly, the thin film structure 28 may have a laminated structure that includes a plurality of first thin films 28a and a plurality of second thin films 28a, which may be alternately formed on the substrate 25. According to some embodiments of the present invention, various thin film structures including hafnium titanium oxide may be obtained by employing an atomic layer deposition (ALD) process.

Some embodiments of the present invention provide methods of manufacturing a gate structure in accordance with some embodiments of the present invention.

Figure 12:
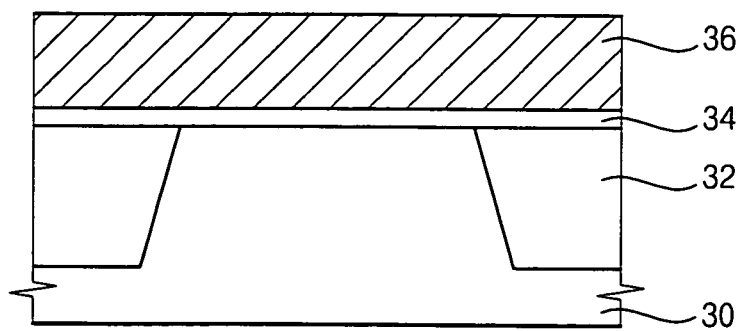
FIGS. 12 and 13 present cross-sectional views illustrating methods of manufacturing a gate structure in accordance with some embodiments of the present invention.

Referring to FIG. 12, an isolation layer 32 is formed on a substrate 30 to define an active region and a field region. The substrate 30 may include a silicon wafer or a silicon on insulator (SOI) substrate. The isolation layer 32 may be formed on the substrate 30 using an isolation process such as a shallow trench isolation (STI) process.

A gate insulation layer 34 may be formed on the substrate 30 by processes substantially similar to those described with reference to FIGS. 1 to 8. Thus, the gate insulation layer 34 may include hafnium titanium oxide with a high dielectric constant. Additionally, the gate insulation layer 34 may have a desired thickness and/or a desired ratio between hafnium and titanium, which may be achieved by adjusting the number of iterations of steps for forming a hafnium oxide film and titanium oxide film.

In some embodiments of the present invention, a thin oxide film may be formed on the gate insulation layer 34. The thin oxide film may have a thickness of about 5 Å and include silicon oxide. In some embodiments, the thin oxide film may be formed in-situ on the gate isolation layer 34. A gate conductive layer 36 may be formed on the gate insulation layer 34. The gate conductive layer may include a conductive material such as doped polysilicon. Alternatively, the gate conductive layer 36 may include a metal or a conductive metal nitride. The gate conductive layer 36 may be formed on the gate insulation layer 34 by a suitable process including, but not limited to, a chemical vapor deposition (CVD) process, a sputtering process or a pulse laser deposition (PLD) process.

Figure 13:
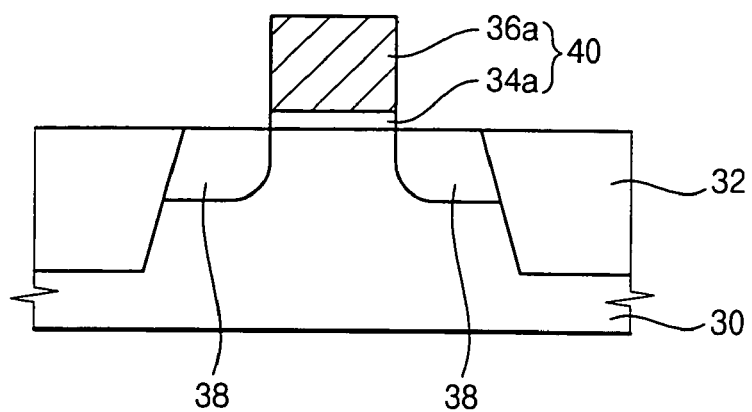

Referring to FIG. 13, the gate conductive layer 36 and the gate insulation layer 34 are partially etched to thereby form a gate structure 40 on the substrate 30. The gate structure 40 includes a gate insulation pattern 34a and a gate conductive pattern 36a sequentially formed on the substrate 30. The gate conductive layer 36 and the gate insulation layer 34 may be sequentially patterned by a photolithography process. When the gate structure 40 is formed on the active region of the substrate 30, portions of the active region adjacent to the gate structure 40 may be exposed. Impurities are implanted into the exposed portions of the active region so that source/drain regions 38 are formed in the active region. The source/drain regions 38 may be formed through an ion implantation process. In some embodiments of the present invention, the source/drain regions 38 may be formed before the gate structure 40 is formed on the substrate 30. In some embodiments of the present invention, a gate spacer may be formed on a sidewall of the gate structure 40. The gate spacer may include a nitride such as silicon nitride.

The gate insulation pattern 34a may have a desired thickness and/or a desired ratio between hafnium and titanium by controlling the number of iterations of performing the steps for forming the hafnium oxide film and the titanium oxide film. In some embodiments, the gate insulation pattern 34a may have a dielectric constant of above about 50. As a result, the gate insulation pattern 34a may prevent leakage current flowing from the gate conductive pattern 36a to the substrate 30 while the gate insulation pattern 34a may have a thin equivalent oxide thickness.

Figure 14:
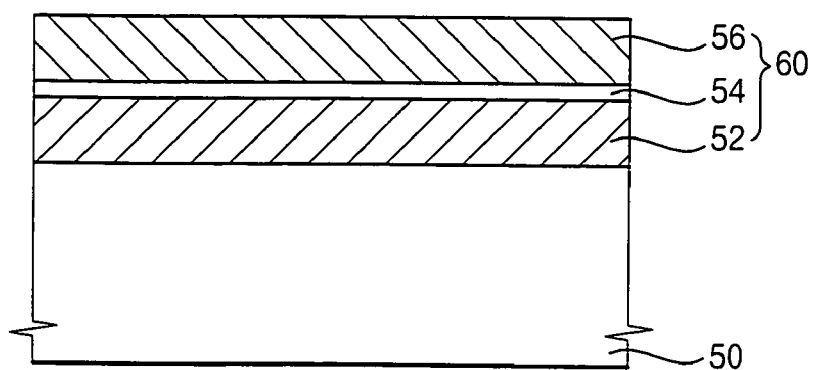
FIG. 14 presents a cross-sectional view illustrating methods of manufacturing a capacitor in accordance with some embodiments of the present invention.

Some embodiments of the present invention provide methods of manufacturing a capacitor. Referring to FIG. 14, a lower electrode 52 is formed on a substrate 50. The substrate 50 may include a silicon wafer or an SOI substrate. A conductive structure may be formed on the substrate 50. The conductive structure may include a gate structure, a pad, a contact region, a contact, a conductive wiring, a conductive pattern, etc. The lower electrode 52 may include a conductive material such as doped polysilicon. Alternatively, the lower electrode 52 may include a metal or a conductive metal nitride. The lower electrode 52 may be formed on the substrate 50 by a suitable process including, but not limited to, a chemical vapor deposition (CVD process, a sputtering process or a pulse laser deposition (PLD) process. The lower electrode 52 may have a cylindrical shape in order to enlarge an effective area of a capacitor 60.

A dielectric layer 54 including hafnium titanium oxide is formed on the lower electrode 52 by processes substantially similar to those described with reference to FIGS. 1 to 8.

Since the dielectric layer 54 is formed using an atomic layer deposition process, the dielectric layer 54 may have a desired thickness and/or a desired ratio between hafnium and titanium by controlling the number of iterations of performing processes for forming the hafnium oxide film and the titanium oxide film.

An upper electrode 56 is formed on the dielectric layer 54. The upper electrode 56 may include a conductive material such as doped polysilicon. Alternatively, the upper electrode 56 may include a metal or a conductive metal nitride. The upper electrode 56 may be formed on the dielectric layer 54 employing a process including, but not limited to, a chemical vapor deposition process, a sputtering process, or a pulse laser deposition process. Therefore, the capacitor 60 including the lower electrode 52, the dielectric layer 54 and the upper electrode 56 is formed on the substrate 50.

As described above, the dielectric layer 56 including hafnium titanium oxide may have a dielectric constant of above about 50 and/or a thin equivalent oxide thickness.

EXAMPLE 1

Figure 15:
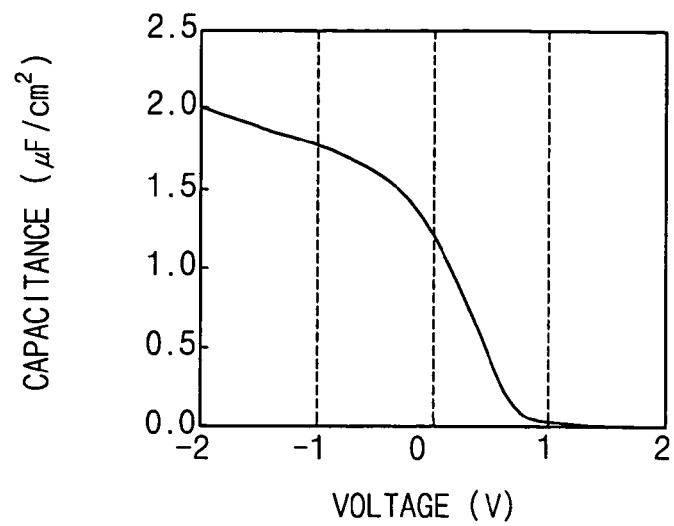
FIG. 15 presents a graph illustrating a capacitance of a thin film including hafnium titanium oxide in accordance with some embodiments of the present invention.

Measurement of a Capacitance of a Thin Film According to Embodiments of the Present Invention FIG. 15 presents a graph illustrating a capacitance of a thin film structure including hafnium titanium oxide in accordance with some embodiments of the present invention. Moreover, FIG. 15 shows the capacitance of the thin film structure of hafnium titanium oxide relative to an applied voltage. Referring to FIG. 15, an electrode including platinum (Pt) was formed on the thin film structure after the thin film structure of hafnium titanium oxide was formed through processes substantially similar to those described with reference to FIGS. 1 to 8. More specifically, a thin film structure including hafnium titanium oxide was formed by providing $Hf[N(CH_3)_2]_4$ for about one second, introducing an argon gas for about one second, providing an ozone gas for about 2 seconds, and introducing an argon gas for about three seconds, wherein the steps were carried out at least once, thereby forming a hafnium oxide having a thickness of about 30 Å. The hafnium oxide film was formed at a temperature of about 300° C. Further steps included providing $TiCl_4$ for about one second, introducing an argon gas for about one second, providing an ozone gas for about 2 seconds, and introducing an argon gas for about three seconds, wherein the steps were executed at least once, thereby forming a titanium oxide having a thickness of about 100 Å. The titanium oxide film was formed at a temperature of about 300° C.

As shown in FIG. 15, the thin film structure of hafnium titanium oxide possessed a desirable capacitance-voltage (C-V) characteristic in which the capacitance was above about 1.8 μF/cm² under the applied voltage of below about −1V. Therefore, when the thin film including hafnium titanium oxide is employed for a dielectric layer of a capacitor, the capacitor may possess desirable electrical characteristics.

EXAMPLE 2

Figure 16:
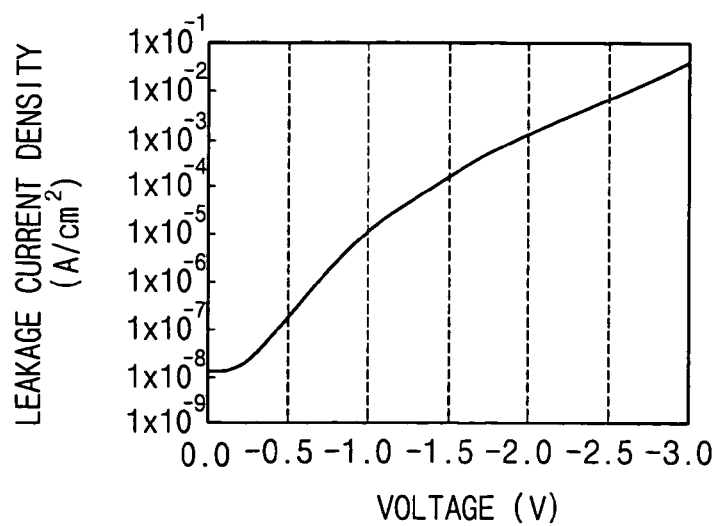
FIG. 16 presents a graph illustrating leakage current density of a thin film including hafnium titanium oxide in accordance with some embodiments of the present invention.

Measurement of a Leakage Current Density of a Thin Film According to Embodiments of the Present Invention FIG. 16 presents a graph illustrating a leakage current density of a thin film structure including hafnium titanium oxide in accordance with some embodiments of the present invention. FIG. 16 shows the leakage current density of the thin film of hafnium titanium oxide structure relative to an applied voltage.

Referring to FIG. 16, after the thin film structure of hafnium titanium oxide was formed through processes substantially similar to those described with reference to FIGS. 1 to 8, an electrode including platinum was formed on the thin film structure of hafnium titanium. Particularly, the thin film structure including hafnium titanium oxide was formed by providing $Hf[N(CH_3)_2]_4$ for about one second, introducing an argon gas for about one second, providing an ozone gas for about 2 seconds, and introducing an argon gas for about three seconds, wherein the steps were carried out at least once, thereby forming a hafnium oxide film having a thickness of about 30 Å. The hafnium oxide film was formed at a temperature of about 300° C. Further steps included providing $TiCl_4$ for about one second, introducing an argon gas for about one second, providing an ozone gas for about 2 seconds, and introducing an argon gas for about three seconds, wherein the steps were executed at least once, thereby forming a titanium oxide film having a thickness of about 100 Å. The titanium oxide film was formed at a temperature of about 300° C.

As shown in FIG. 16, when the applied voltage was about −1.5V, the thin film structure of hafnium titanium oxide had a minute leakage current density of about $1 \times 10^{-4}$ A/cm². Therefore, the thin film including hafnium titanium oxide may be employed for a dielectric layer of a capacitor to improve electrical characteristics of the capacitor.

EXAMPLE 3

Figure 17:
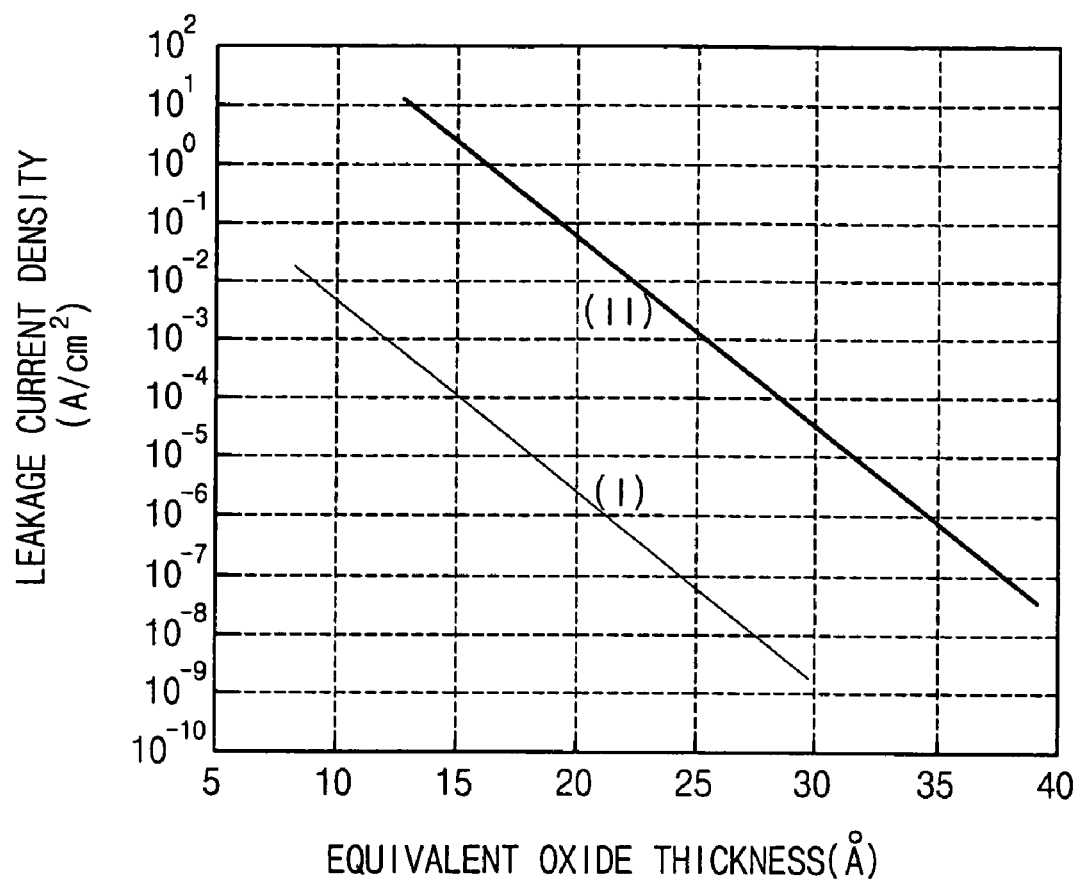
FIG. 17 presents a graph illustrating leakage current densities of (a) a thin film including hafnium titanium oxide in accordance with some embodiments of the present invention, and (b) a conventional oxide layer.

Measurement of Leakage Current Densities of a Thin Film According to Embodiments of the Present Invention and a Conventional Oxide Layer FIG. 17 presents a graph illustrating leakage current densities of a thin film structure of hafnium titanium oxide and a conventional oxide layer in accordance with some embodiments of the present invention. In FIG. 17, "I" represents a leakage current density of the thin film structure of hafnium titanium oxide and "II" indicates a leakage current density of the conventional oxide layer.

Referring to FIG. 17, an electrode including platinum was formed on the thin film structure I of hafnium titanium oxide, after the thin film structure I of hafnium titanium oxide was formed through processes substantially similar to those described with reference to FIGS. 1 to 8. Particularly, the thin film structure including hafnium titanium oxide was formed by providing $Hf[N(CH_3)_2]_4$ for about one second, introducing an argon gas for about one second, providing an ozone gas for about 2 seconds, and introducing an argon gas for about three seconds, wherein the steps were carried out at least once, thereby forming a hafnium oxide having a thickness of about 30 Å. The hafnium oxide film was formed at a temperature of about 300° C. Further steps included providing $TiCl_4$ for about one second, introducing an argon gas for about one second, providing an ozone gas for about 2 seconds, and introducing an argon gas for about three seconds, wherein the steps were executed at least once, thereby forming a titanium oxide having a thickness of about 100 Å. The titanium oxide film was formed at a temperature of about 300° C. In contrast, the conventional oxide layer II was formed by a conventional chemical vapor deposition process.

As shown in FIG. 17, when the thin film structure I had an equivalent oxide thickness substantially similar to that of the conventional oxide layer II, the thin film structure I had a leakage current density of about more than 10,000 times lower than that of the conventional oxide layer II when applying a voltage of about −1.0V. Therefore, the thin film structure I of hafnium titanium oxide may be employed for a dielectric layer of a capacitor to potentially enhance electrical characteristics of the capacitor.

According to some embodiments of the present invention, a thin film including hafnium titanium oxide having a high dielectric constant may be formed so that a semiconductor device including a gate structure or a capacitor may have desirable electrical characteristics when the thin film structure is employed as a dielectric layer of the capacitor or as a gate insulation layer of the gate structure.

The foregoing is illustrative of the present invention and is not to be construed as limiting thereof. Although some embodiments of this invention have been described, one of ordinary skill in the art will readily appreciate that modifications to the embodiments are possible without departing from the teachings of the invention. Accordingly, all such modifications are intended to be included within the scope of this invention as defined in the claims, with equivalents of the claims to be included therein.

What is claimed is:

1. A method of manufacturing a thin film comprising:
   introducing a first reactant comprising a hafnium precursor onto a substrate;
   chemisorbing a first portion of the first reactant to the substrate, and physisorbing a second portion of the first reactant to the substrate and the chemisorbed first portion of the first reactant;
   providing a first oxidant onto the substrate;
   forming a first thin film comprising hafnium oxide on the substrate by chemically reacting the first oxidant with the chemisorbed first portion of the first reactant;
   introducing a second reactant comprising a titanium precursor onto the first thin film;
   chemisorbing a first portion of the second reactant to the first thin film, and physisorbing a second portion of the second reactant to the first thin film and the chemisorbed first portion of the second reactant;
   providing a second oxidant onto the first thin film; and
   forming a second thin film comprising titanium oxide on the first thin film by chemically reacting the second oxidant with the chemisorbed first portion of the second reactant.

2. The method of claim 1, wherein the hafnium precursor comprises tetrakis dimethyl amino hafnium ($Hf[N(CH_3)_2]_4$; TDMAH), tetrakis ethyl methyl amino hafnium ($Hf[N(C_2H_5)CH_3]_4$; TEMAH), tetrakis diethyl methyl amino hafnium ($Hf[N(C_2H_5)_2]_4$; TDEAH), $HF[OC(CH_3)_2CH_2OCH_3]_4$, $HF[OC(CH_3)_3]_4$ or a combination thereof.

3. The method of claim 1, wherein the titanium precursor comprises $TiCl_4$, $Ti(OC_2H_5)_4$, $Ti(OC_3H_7)_4$, $Ti(OC_4H_9)_4$, $Ti(O-i-Pr)_2(thd)_2$, $Ti(tmhd)_2(O-i-Pr)_2$, $TiO(DPM)_2$-[titanyl bis(dipivaloylmethanato)], $Ti(MMP)_4$-[$Ti(OC_4H_8OCH_3)$] or a combination thereof.

4. The method of claim 1, wherein the first oxidant and the second oxidant independently comprise $O_3$, $H_2O$, $H_2O_2$, $CH_3OH$, $C_2H_5OH$ or a combination thereof.

5. The method of claim 1, wherein the thin film comprises a gate insulation layer of a transistor.

6. The method of claim 1, wherein the thin film comprises a dielectric layer of a capacitor.

7. The method of claim 1, wherein the method is performed at a temperature in a range of about 150° C. to about 400° C.

8. The method of claim 1, wherein the method is performed at least once.

9. The method of claim 1, wherein at least one process in the method is performed at least twice.

10. The method of claim 1, further comprising:
    removing the physisorbed second portion of the first reactant;
    removing an unreacted first oxidant;
    removing the physisorbed second portion of the second reactant; and
    removing an unreacted second oxidant.

11. A method of manufacturing a gate structure comprising:
    forming a gate insulation layer on a substrate by atomic layer deposition (ALD) using a hafnium precursor, a titanium precursor and an oxidant, wherein the gate insulation layer comprises hafnium titanium oxide;
    forming a gate conductive layer on the gate insulation layer; and
    forming a gate insulation pattern and a gate conductive pattern on the substrate by etching the gate conductive layer and the gate insulation layer.

12. The method of claim 11, wherein the gate conductive layer and/or the gate insulation layer are partially etched.

13. The method of claim 11, wherein forming the gate insulation layer comprises:
    introducing a first reactant comprising the hafnium precursor onto the substrate;
    chemisorbing a first portion of the first reactant to the substrate, and physisorbing a second portion of the first reactant to the substrate and the chemisorbed first portion of the first reactant;
    removing the physisorbed second portion of the first reactant;
    providing a first oxidant onto the substrate;
    forming a first thin film comprising hafnium oxide on the substrate by chemically reacting the first oxidant with the chemisorbed first portion of the first reactant;
    removing an unreacted first oxidant;
    introducing a second reactant comprising the titanium precursor onto the first thin film;
    chemisorbing a first portion of the second reactant to the first thin film, and physisorbing a second portion of the second reactant to the first thin film and the chemisorbed first portion of the second reactant;
    removing the physisorbed second portion of the second reactant;
    providing a second oxidant onto the first thin film;
    forming a second thin film comprising titanium oxide on the first thin film by chemically reacting the second oxidant with the chemisorbed first portion of the second reactant; and
    removing an unreacted second oxidant.

14. The method of claim 13, wherein the hafnium precursor comprises tetrakis dimethyl amino hafnium ($Hf[N(CH_3)_2]_4$; TDMAH), tetrakis ethyl methyl amino hafnium ($Hf[N(C_2H_5)CH_3]_4$; TEMAH), tetrakis diethyl methyl amino hafnium ($Hf[N(C_2H_5)_2]_4$; TDEAH), $HF[OC(CH_3)_2CH_2OCH_3]_4$, $HF[OC(CH_3)_3]_4$ or a combination thereof.

15. The method of claim 13, wherein the titanium precursor comprises $TiCl_4$, $Ti(OC_2H_5)_4$, $Ti(OC_3H_7)_4$, $Ti(OC_4H_9)_4$, $Ti(O-i-Pr)_2(thd)_2$, $Ti(tmhd)_2(O-i-Pr)_2$, $TiO(DPM)_2$-[titanyl bis(dipivaloylmethanato)], $Ti(MMP)_4$-[$Ti(OC_4H_8OCH_3)$] or a combination thereof.

16. The method of claim 13, wherein the first oxidant and the second oxidant independently comprise $O_3$, $H_2O$, $H_2O_2$, $CH_3OH$, $C_2H_5OH$ or a combination thereof.

17. The method of claim 13, wherein the method is performed at a temperature in a range of about 150° C. to about 400° C.

18. The method of claim 13, wherein the method is performed at least once.

19. The method of claim 13, wherein at least one process in the method is performed at least twice.

20. A method of manufacturing a capacitor comprising:
forming a lower electrode on a substrate;
forming a dielectric layer on the lower electrode by atomic layer deposition (ALD) using a hafnium precursor, a titanium precursor and an oxidant, wherein the dielectric layer comprises hafnium titanium oxide; and
forming an upper electrode on the dielectric layer.

21. The method of claim 20, wherein forming the dielectric layer further comprises:
introducing a first reactant comprising the hafnium precursor onto the lower electrode;
chemisorbing a first portion of the first reactant to the lower electrode, and physisorbing a second portion of the first reactant to the lower electrode and the chemisorbed first portion of the first reactant;
removing the physisorbed second portion of the first reactant;
providing a first oxidant onto the lower electrode;
forming a first thin film comprising hafnium oxide on the substrate by chemically reacting the first oxidant with the chemisorbed first portion of the first reactant;
removing an unreacted first oxidant;
introducing a second reactant comprising the titanium precursor onto the first thin film;
chemisorbing a first portion of the second reactant to the first thin film, and physisorbing a second portion of the second reactant to the first thin film and the chemisorbed first portion of the second reactant;
removing the physisorbed second portion of the second reactant;
providing a second oxidant onto the first thin film;
forming a second thin film comprising titanium oxide on the first thin film by chemically reacting the second oxidant with the chemisorbed first portion of the second reactant; and
removing an unreacted second oxidant.

22. The method of claim 21, wherein the hafnium precursor comprises tetrakis dimethyl amino hafnium ($Hf[N(CH_3)_2]_4$; TDMAH), tetrakis ethyl methyl amino hafnium ($Hf[N(C_2H_5)CH_3]_4$; TEMAH), tetrakis diethyl methyl amino hafnium ($Hf[N(C_2H_5)_2]_4$; TDEAH), $HF[OC(CH_3)_2CH_2OCH_3]_4$, $HF[OC(CH_3)_3]_4$ or a combination thereof.

23. The method of claim 21, wherein the titanium precursor comprises $TiCl_4$, $Ti(OC_2H_5)_4$, $Ti(OC_3H_7)_4$, $Ti(OC_4H_9)_4$, $Ti(O\text{-}i\text{-}Pr)_2(thd)_2$, $Ti(tmhd)_2(O\text{-}i\text{-}Pr)_2$, $TiO(DPM)_2$-[titanyl bis(dipivaloylmethanato)], $Ti(MMP)_4$-[$Ti(OC_4H_8OCH_3)$] or a combination thereof.

24. The method of claim 21, wherein the first oxidant and the second oxidant independently comprise $O_3$, $H_2O$, $H_2O_2$, $CH_3OH$, $C_2H_5OH$ or a combination thereof.

25. The method of claim 21, wherein the method is performed at a temperature in a range of about 150° C. to about 400° C.

26. The method of claim 21, wherein the method is performed at least once.

27. The method of claim 21, wherein at least one process in the method is performed at least twice.

* * * * *